US012581944B2

(12) United States Patent
Liu et al.

(10) Patent No.: US 12,581,944 B2
(45) Date of Patent: Mar. 17, 2026

(54) SEMICONDUCTOR STRUCTURE

(71) Applicant: Changxin Memory Technologies, Inc., Hefei (CN)

(72) Inventors: Xusheng Liu, Hefei (CN); Jihoon Lee, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 597 days.

(21) Appl. No.: 18/093,652

(22) Filed: Jan. 5, 2023

(65) Prior Publication Data

US 2023/0378049 A1 Nov. 23, 2023

Related U.S. Application Data

(63) Continuation of application No. PCT/CN2022/112868, filed on Aug. 16, 2022.

(30) Foreign Application Priority Data

May 17, 2022 (CN) ......................... 202210535941.X

(51) Int. Cl.
| | |
|---|---|
| *H01L 23/522* | (2006.01) |
| *H01L 23/528* | (2006.01) |
| *H10D 84/00* | (2025.01) |

(52) U.S. Cl.
CPC ...... *H01L 23/5223* (2013.01); *H01L 23/5226* (2013.01); *H01L 23/528* (2013.01); *H10D 84/212* (2025.01)

(58) Field of Classification Search
CPC .......... H01B 17/28; H05K 2291/10015; H01L 23/49589; H01L 23/5223; H01L 23/5226;
(Continued)

(56) References Cited

U.S. PATENT DOCUMENTS 6,204,723 B1 * 3/2001 Houghton ........... G11C 11/4074
327/540
11,406,025 B2 8/2022 Fujita
(Continued)

FOREIGN PATENT DOCUMENTS

| CN | 110580923 A | 12/2019 |
|---|---|---|
| CN | 111345121 A | 6/2020 |

OTHER PUBLICATIONS

PCT International Search Report and the Written Opinion mailed Jan. 19, 2023, issued in related International Application No. PCT/CN2022/112868, with English translation (18 pages).

*Primary Examiner* — Galina G Yushina

(74) *Attorney, Agent, or Firm* — Sheppard Mullin Richter & Hampton LLP

(57) ABSTRACT

A semiconductor structure includes: at least one first conducting layer between a first wire and a second wire; a plurality of capacitor banks respectively located on the first wire, the second wire, or the first conducting layer, and two capacitor banks are located on each first conducting layer; a third wire is located above and connected to the first wire through a via hole, and a fourth wire is located above and connected to the second wire through a via hole; at least one capacitor plate located on the second electrode layer, and second electrode layers of two adjacent capacitor banks are electrically connected to a same capacitor plate; at least one second conducting layer located between the third wire and the fourth wire, and an orthographic projection of the second conducting layer on a plane on which the capacitor plates are located is located between two adjacent capacitor plates.

15 Claims, 6 Drawing Sheets

(58) Field of Classification Search
CPC .... H01L 23/528; H10B 12/03; H10D 84/212;
H10D 1/692
See application file for complete search history.

(56) References Cited

U.S. PATENT DOCUMENTS

| | | | |
|---|---|---|---|
| 2004/0056286 A1* | 3/2004 | Jacob | H10B 53/30 |
| | | | 257/295 |
| 2004/0094790 A1* | 5/2004 | Kanaya | H10B 53/00 |
| | | | 257/295 |
| 2019/0378556 A1* | 12/2019 | Lim | G11C 5/025 |
| 2020/0098853 A1 | 3/2020 | Haraguchi et al. | |
| 2021/0050410 A1* | 2/2021 | Haraguchi | H01G 4/385 |
| 2021/0118618 A1 | 4/2021 | Shin et al. | |
| 2021/0350198 A1* | 11/2021 | Finn | G06K 19/07722 |
| 2022/0246605 A1* | 8/2022 | Tanaka | H03H 9/1021 |
| 2023/0068172 A1* | 3/2023 | Yang | G11C 5/10 |

* cited by examiner

VDD
VSS
FIG. 1
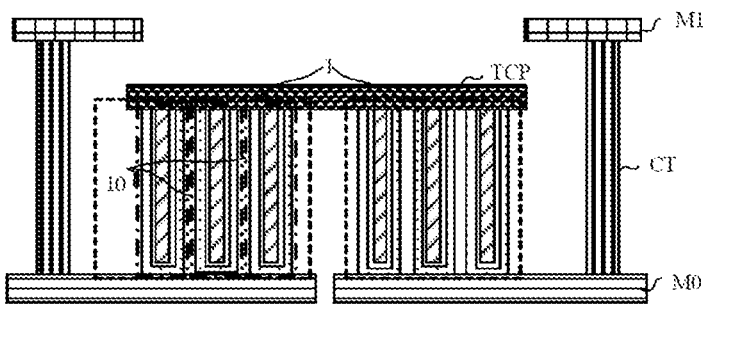
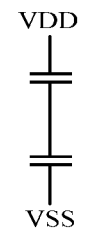
Upper electrode layer
Lower electrode layer
FIG. 2a
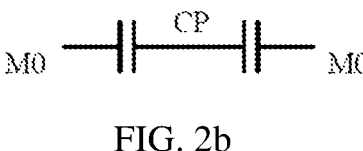
M0 —|| CP ||— M0
FIG. 2b
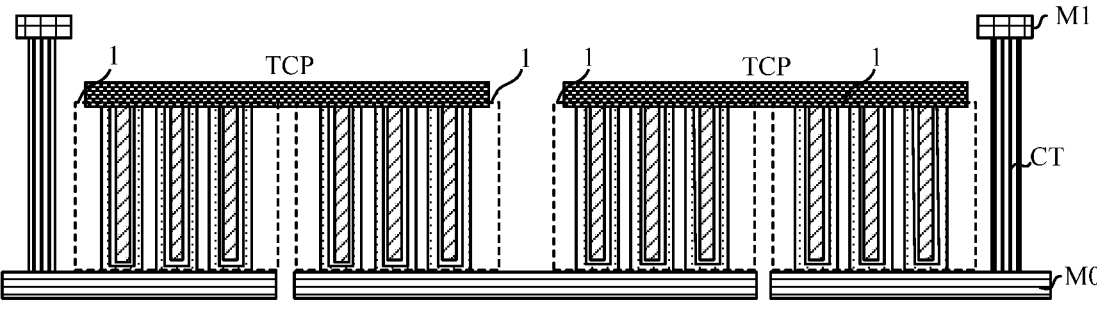
FIG. 3

1

SEMICONDUCTOR STRUCTURE

CROSS-REFERENCE TO RELATED APPLICATIONS

This application is a continuation application of International Patent Application No. PCT/CN2022/112868, filed on Aug. 16, 2022, which claims priority to Chinese Patent Application No. 202210535941.X, filed with the China National Intellectual Property Administration on May 17, 2022 and entitled "SEMICONDUCTOR STRUCTURE." The above-referenced applications are incorporated herein by reference in their entirety.

TECHNICAL FIELD

This application relates to semiconductor technologies, and in particular, to a semiconductor structure.

BACKGROUND

Capacitors can store energy. Therefore, in circuit design, circuit designers usually add a large number of capacitors between various potentials. Moreover, by utilizing the charging and discharging characteristics of a capacitor, the stability of potentials of two electrodes of the capacitor can be enhanced.

However, it's desirable to provide a capacitor structure that can be flexibly adjusted based on its practical application.

SUMMARY

This application provides a semiconductor structure with a capacitor structure that can be flexibly adjusted.

According to a first aspect, this application provides a semiconductor structure, including: a first wire, a second wire, and at least one first conducting layer located between the first wire and the second wire; a plurality of capacitor banks, where each capacitor bank is respectively located on the first wire, the second wire, or the first conducting layer, and two capacitor banks are located on each first conductive layer, and where each capacitor bank includes at least one capacitor, the capacitor includes a first electrode layer, a capacitor dielectric layer, and a second electrode layer sequentially from bottom to top, the first electrode layer of each capacitor bank is respectively electrically connected to the corresponding first wire, second wire, or first conducting layer; a third wire and a fourth wire, where the third wire is located above the first wire and is connected to the first wire through a via hole, and the fourth wire is located above the second wire and is connected to the second wire through a via hole; at least one capacitor plate located above the second electrode layers, where along a direction from the first wire to the second wire, second electrode layers of two adjacent capacitor banks are electrically connected to a same capacitor plate; and at least one second conducting layer, where the second conducting layer is located between the third wire and the fourth wire, and an orthographic projection of the second conducting layer on a plane on which the capacitor plates are located is located between two adjacent capacitor plates.

The semiconductor structure provided in the embodiments of this application includes: a first wire, a second wire, and at least one first conducting layer located between the first wire and the second wire; a plurality of capacitor banks, where each capacitor bank is respectively located on the first wire, the second wire, or the first conducting layer, and two capacitor banks are located on each first conducting layer; and where each capacitor bank includes at least one capacitor, the capacitor includes a first electrode layer, a capacitor dielectric layer, and a second electrode layer sequentially from bottom to top, the first electrode layer is respectively electrically connected to the corresponding first wire, second wire, or first conducting layer; at least one capacitor plate located on the second electrode layer, where along a direction from the first wire to the second wire, second electrode layers of two adjacent capacitor banks are electrically connected to a same capacitor plate; and a third wire, a fourth wire, and a second conducting layer located between the third wire and the fourth wire, where the third wire is located above the first wire and is connected to the first wire, the fourth wire is located above the second wire and is connected to the second wire, and an orthographic projection of the second conducting layer on a plane on which the capacitor plates are located is located between two adjacent capacitor plates. In this application, the second conducting layer is reserved. When the capacitance of the capacitor needs to be adjusted, only a portion of the structure, instead of the entire structure, needs to be changed to implement a capacitor structure that can be flexibly adjusted.

DESCRIPTIONS OF DRAWINGS

The accompanying drawings together with this specification are used to illustrate embodiments consistent with this application and explain the principle of this application.

FIG. 1 is an exemplary diagram of a model of a power capacitor in circuit design.

FIG. 2a is an exemplary cross-sectional view of a capacitor structure, and FIG. 2b is an equivalent diagram of FIG. 2a.

FIG. 3 is an exemplary cross-sectional view of the structure of a plurality of capacitor arrays (NiCaps) in series.

FIG. 5b is a top view of FIG. 5a.

FIG. 7b is a top view of FIG. 7a.

FIG. 8b is a top view of FIG. 8a.

FIG. 10b is a top view of FIG. 10a.

FIG. 14b is a top view of FIG. 14a.

Figure 4:
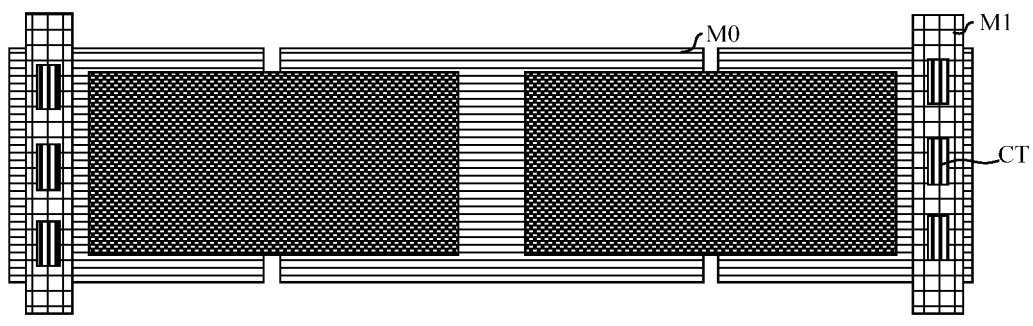
FIG. 4 is a top view of FIG. 3.

Exemplary embodiments of this application are illustrated by the accompanying drawings and will be described in detail below. These drawings and descriptions do not limit the scope of the concepts of this application in any way but are merely intended to illustrate the concepts of this application to a person skilled in the art with reference to exemplary embodiments.

DESCRIPTION OF EMBODIMENTS

Exemplary embodiments will be described in detail herein and illustrated in the accompanying drawings. When accompanying drawings are involved in the following descriptions, the same numerals in different accompanying drawings represent the same or similar elements unless otherwise indicated. The implementations described in the illustrative embodiments below are not intended to represent all implementations consistent with this application. On the contrary, they are merely examples of apparatuses and methods consistent with some aspects of this application as recited in the appended claims.

Terms such as "including" and "having" in this application are used to indicate inclusive inclusion and mean that additional elements, components, or the like may exist in addition to the listed elements, components, or the like. Terms such as "first" and "second" are used only as labels and are not intended to limit the number of corresponding objects. In this application, unless otherwise stated, the orientation words such as "upper", "lower", "left", and "right" generally refer to upper, lower, left and right as shown in the accompanying drawings. "Inside" and "outside" refer to inside and outside relative to the contours of each component itself. It is to be understood that the foregoing orientation words represent relative terms and are used in this specification only for convenience. For example, according to the orientation of the examples shown in the accompanying drawings, if the apparatuses are turned upside down, "upper" components will become "lower" components. In the accompanying drawings, the shapes shown may be distorted due to manufacturing processes and/or tolerances. Therefore, the exemplary embodiments of this application are not limited to the specific shapes shown in the accompanying drawings, and may include shape changes caused during manufacturing. Furthermore, elements and regions in the figures are merely schematic. Therefore, this application is not limited to the dimensions or distances shown in the figures.

In circuit design, to enhance the stability of potentials, capacitors are added between the potentials. Capacitors can store energy. Therefore, the stability of two potentials of a capacitor can be enhanced by utilizing the charging and discharging characteristics of the capacitor. FIG. 1 is an exemplary diagram of a model of a power capacitor in circuit design. As shown in FIG. 1, a capacitor is provided between two power supplies, for example, VDD and VSS. The power capacitor shown in the figure includes a plurality of capacitors in series.

During practical application, the series capacitors may be NiCaps. FIG. 2a is an exemplary cross-sectional view of a capacitor structure, and FIG. 2b is an equivalent diagram of FIG. 2a. The capacitor structure is described with reference to the figures. The capacitor structure includes two wires M1 and two wires M0, and the wires M1 are respectively connected to the wires M0 through via holes CT. One capacitor bank 1 is located on each wire M0. Each capacitor bank 1 includes at least one capacitor 10 (for example, three capacitors are illustrated in FIG. 2a). A first electrode layer of each capacitor bank 1 is connected to the wire M0 on which the capacitor bank 1 is located. Second electrode layers of the capacitor banks 1 on the two wires M0 are connected to one top container plate (TCP) to form a capacitor CP shown in the equivalent diagram of FIG. 2b. Two terminals of the capacitor CP are wires M0. For example, when two wires M1 connected to the wires M0 in FIG. 2a are respectively connected to VDD and VSS, the model of the power capacitor shown in FIG. 1 is formed.

It should be noted that the foregoing is merely an example, and the capacitor structure may also be used to improve the stability of potentials other than the potential of power supply. In addition, the number of capacitors in series may alternatively not be limited to what is shown in the figure. For example, for two potentials with a large voltage difference, a plurality of NiCaps in series may be used to divide the voltage. FIG. 3 is an exemplary cross-sectional view of a structure of a plurality of NiCaps in series (for example, two NiCaps in series are illustrated in FIG. 3). FIG. 4 is a top view of FIG. 3. As shown in FIG. 3 and FIG. 4, the two NiCaps are connected in series through wires M0 in the middle.

The inventor of this application finds that a capacitor affects the response speed of a potential such as the potential of a power supply. Therefore, the capacitance of the capacitor needs to be adjusted based on actual requirements of a circuit. For example, in the examples in FIG. 3 and FIG. 4, although a plurality of NiCap structures in series are disposed to deal with the large voltage difference, in the subsequent design or application of the circuit, the actual voltage difference may not reach the expected value. Consequently, some capacitance is sacrificed. Therefore, the capacitance of a capacitor usually needs to be adjusted based on practical application. That is, a capacitor that can be flexibly adjusted is desirable.

The technical solutions of this application are described in detail below with exemplary embodiments. These exemplary embodiments may be combined with each other. Same or similar concepts or processes may not be repeated in some embodiments. The embodiments of this application are described below with reference to the accompanying drawings.

Figure 5A:
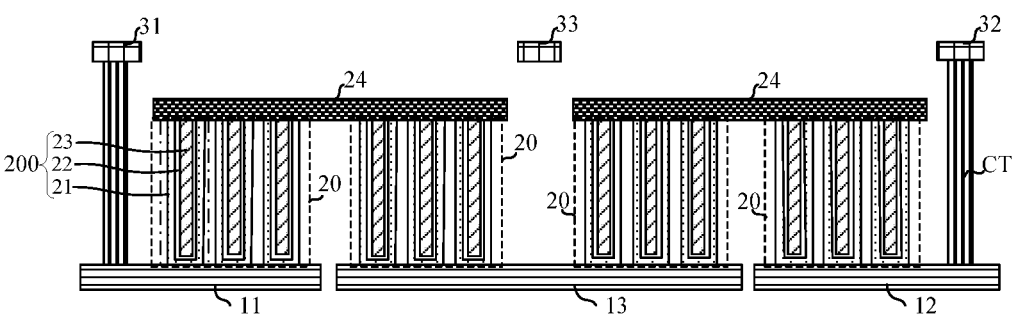
FIG. 5a is an exemplary diagram of a semiconductor structure according to an embodiment of this application.
Figure 5B:
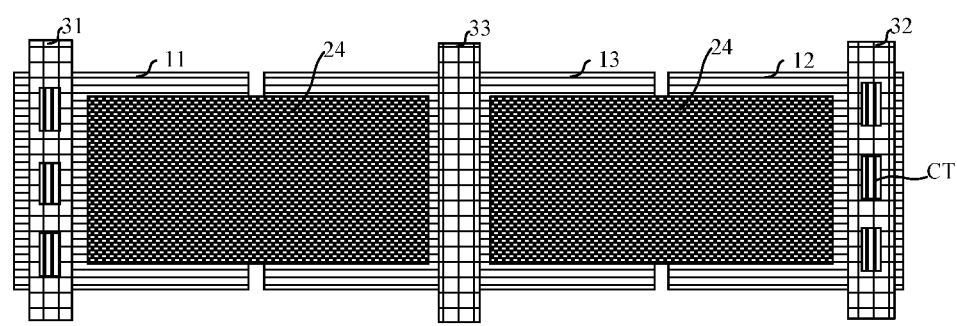

FIG. 5a is an exemplary diagram of a semiconductor structure according to an embodiment of this application, and FIG. 5b is a top view of FIG. 5a. As shown in FIG. 5a and FIG. 5b, the semiconductor structure includes: a first wire 11, a second wire 12, and at least one first conducting layer 13 located between the first wire 11 and the second wire 12; a plurality of capacitor banks 20, where each capacitor bank 20 is respectively located on the first wire 11, the second wire 12, or the first conducting layer 13, and two capacitor banks 20 are located on each first conducting layer 13, and where each capacitor bank 20 includes at least one capacitor 200, the capacitor 200 includes a first electrode layer 21, a capacitor dielectric layer 22, and a second electrode layer 23 sequentially from bottom to top, the first electrode layer 21 of each capacitor bank 20 is respectively electrically connected to the corresponding first wire 11, second wire 12, or first conducting layer 13; a third wire 31 and a fourth wire 32, where the third wire 31 is located above the first wire 11 and is connected to the first wire 11 through a via hole CT, and the fourth wire 32 is located above the second wire 12 and is connected to the second wire 12 through a via hole CT; at least one capacitor plate 24 located on the second electrode layer 23, where along a direction from the first wire 11 to the second wire 12, second electrode layers 23 of two adjacent capacitor banks 20 are electrically connected to a same capacitor plate 24; and at least one second conducting layer 33, where the second conducting layer 33 is located between the third wire 31 and the fourth wire 32, and an orthographic projection of the second conducting layer 33 on a plane on which the capacitor plates are located is located between two adjacent capacitor plates 24.

During practical application, the semiconductor structure may be located on a substrate. The substrate may include a base, or may include a base and a dielectric layer located on an upper surface of the base. By way of example, the substrate includes a base and a dielectric layer. The base may include, but is not limited to, a silicon base, for example, monocrystalline silicon, polycrystalline silicon, amorphous silicon, or silicon germanium (SiGe). The base may include a mixed semiconductor structure, for example, silicon carbide, indium antimonide, lead telluride, indium arsenide, indium phosphide, gallium arsenide, gallium antimonide, an alloy semiconductor, or a combination thereof. The dielectric layer may include, but is not limited to, a silicon oxide layer.

In an embodiment the capacitor bank may include NiCaps. For example, the second electrode layers and first electrode layers of capacitors in the capacitor bank may be conductive material layers.

In an embodiment, the first wire 11, the second wire 12, and the first conducting layer 13 are located in a same layer. The first wire 11, the second wire 12, and the first conducting layer 13 are provided in a same wiring layer to form the foregoing structure simultaneously, thereby simplifying the structure manufacturing process.

In an embodiment, the third wire 31, the fourth wire 32, and the second conducting layer 33 are located in a same layer. Similarly, the third wire 31, the fourth wire 32, and the second conducting layer 33 are provided in a same wiring layer to form the foregoing structure simultaneously, thereby simplifying the structure manufacturing process.

The first wire 11, the second wire 12, the first conducting layer 13, the third wire 31, the fourth wire 32, and the second conducting layer 33 may be made of any conductive materials, for example, including but not limited to copper, aluminum, titanium, or silver. It should be noted that the terms "wire", "conducting layer", and the like used in this specification are not intended to limit the specific shape or size of the structure. For example, the "wire" is not limited to be linear-shaped, and may alternatively be strip-shaped or sheet-shaped. The shape and size of each structure may be determined based on the requirements of circuit and process design.

In the semiconductor structure provided in this application, one or more first conducting layers 13 are located between the first wire 11 and the second wire 12. In an embodiment, when the semiconductor structure includes a plurality of first conducting layers 13, these first conducting layers 13 are arranged at intervals. Two capacitor banks 20 are located on each first conducting layer 13.

In an embodiment, since the first conducting layer 13 is located between the first wire 11 and the second wire 12, only one capacitor bank 20 may be disposed on each of the first wire 11 and the second wire 12, and every two adjacent capacitor banks 20 share one capacitor plate 24. The third wire 31, the fourth wire 32, and the second conducting layer 33 are located above the capacitor plate 24. The second conducting layer 33 is located between the third wire 31 and the fourth wire 32. The third wire 31 is located above the first wire 11 and is connected to the first wire 11 through a via hole, and the fourth wire 32 is located above the second wire 12 and is connected to the second wire 12 through a via hole CT. In an embodiment, an orthographic projection of the third wire 31 on a plane on which the first wire 11 is located is located on the first wire 11, and an orthographic projection of the fourth wire 32 on a plane on which the second wire 12 is located is located on the second wire 12.

In an embodiment, an orthographic projection of the second conducting layer 33 on a plane on which the capacitor plates 24 are located is located between two adjacent capacitor plates 24.

Examples are given based on actual scenarios. Based on the semiconductor structure provided in this application, after the basic structure of the substrate is manufactured, the capacitance of capacitors can still be adjusted. For example, when the capacitance of a capacitor between two potentials needs to be adjusted, a second conducting layer may be selected from reserved second conducting layers and may be connected to the first conducting layer below through a via hole. Subsequently, a corresponding potential may be applied to the second conducting layer connected to the first conducting layer to adjust the capacitance of a capacitor between a potential of the second conducting layer and a potential of the third wire or the fourth wire. The adjustment manner is illustrated in the following embodiments.

In an embodiment, an orthographic projection of the second conducting layer 33 on a plane on which the first conducting layer 13 is located is located on the first conducting layer 13.

In this embodiment, the second conducting layer 33 corresponding to the first conducting layer 13 is located above the first conducting layer 13. When the second conducting layer needs to be connected to the first conducting layer, a via hole vertically extending along the depth direction may be formed to connect the first conducting layer and the second conducting layer. In this way, the area of the via hole can be reduced, thereby facilitating manufacturing and designing process.

During practical application, the second conducting layer that needs to be connected to the first conducting layer may be determined based on an adjustment requirement.

Figure 6:
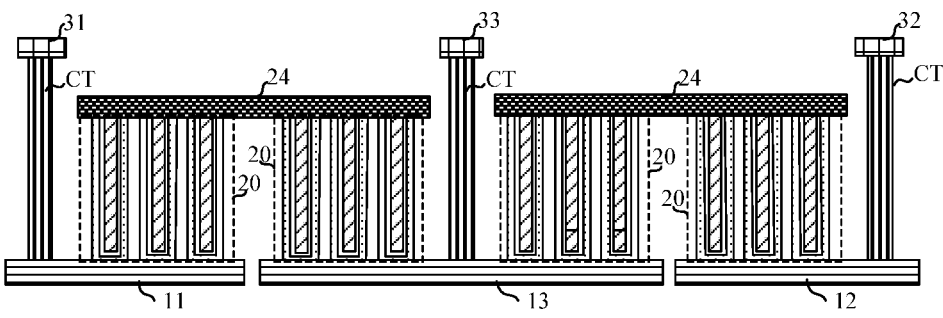
FIG. 6 is an exemplary diagram of a semiconductor structure according to an embodiment of this application.

In an embodiment, as shown in FIG. 6, FIG. 6 is an exemplary diagram of a semiconductor structure according to an embodiment of this application. In this embodiment, at least a portion of the second conducting layer 33 is connected to the first conducting layer 13 under the second conducting layer 33 through a via hole CT.

The term "at least a portion of" may include cases where there is one or more component (e.g. the second conducting layer 33). When the number of the component is more than one, "at least a portion of" may refer to some or all of such component.

During practical application, in the early stage of circuit design, since a simulation result of a capacitor cannot be predicted, second conducting layers are reserved in consideration of the capacitance of the capacitor and various uncertain factors. On the one hand, a large plate voltage can be withstood to avoid an insufficient withstand voltage after a simulation result is determined in the later stage. On the other hand, the design team can perform the main work, and flexibly adjust the capacitance of the capacitor after obtaining the simulation result.

It should be noted that when the capacitance of the capacitor does not need to be adjusted, one manner is not to connect the reserved second conducting layer to the first conducting layer and connect it later when the capacitance of the capacitor needs to be adjusted. The other manner is to connect the second conducting layer to the first conducting layer, and then connect the second conducting layer to a floating potential. Both of the foregoing two manners do not affect the original capacitance of the capacitor. In an embodiment, based on the foregoing embodiment, each second conducting layer 33 connected to the first conducting layer 13 is connected to a floating potential.

When the capacitance of the capacitor needs to be adjusted, a preset potential may be set on the second conducting layer connected to the first conducting layer. In an embodiment, based on the foregoing embodiments, a potential of the second conducting layer 33 connected to the first conducting layer 13 is between a potential of the third wire 31 and a potential of the fourth wire 32.

The semiconductor structure with second conducting layers reserved is described above to flexibly adjust the capacitor. Adjustment manners in different situations are illustrated below.

Figure 7A:
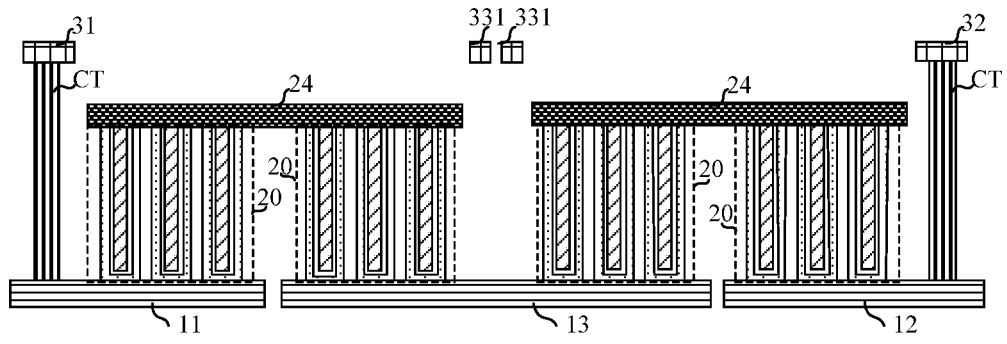
FIG. 7a is an exemplary diagram of a semiconductor structure according to an embodiment of this application.
Figure 7B:
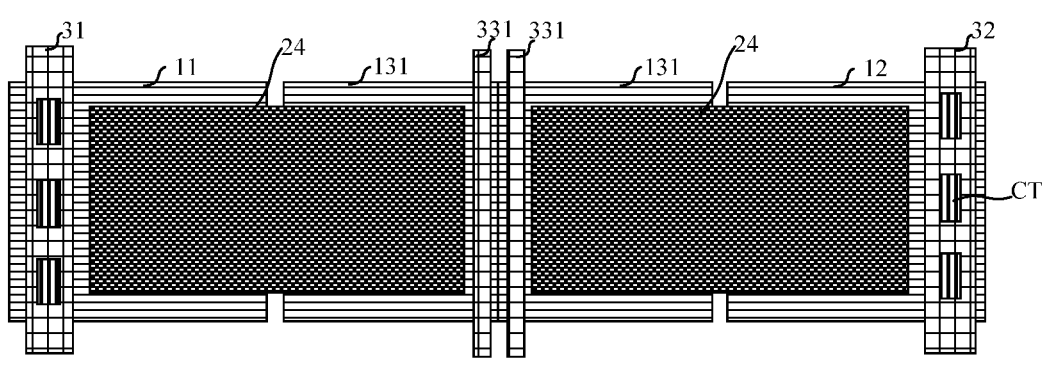

FIG. 7a is an exemplary diagram of a semiconductor structure according to an embodiment of this application, and FIG. 7b is a top view of FIG. 7a. As shown in FIG. 7 a and FIG. 7b, based on any one of the foregoing embodiments, the first conducting layer 13 includes two first sub-conducting layers 131, the second conducting layer 33 includes two second sub-conducting layers 331, and a projection of each second sub-conducting layer 331 on a plane on which the first conducting layer 13 is located is respectively located on one first sub-conducting layer 131.

The number of first conducting layers 13 and second conducting layers 33 may be determined based on requirements. The semiconductor structure shown in FIG. 7 a and FIG. 7b includes one first conducting layer 13. For example, the semiconductor structure may include one first conducting layer 13; and similarly, the semiconductor structure may also include one second conducting layer 33. In an embodiment, the second conducting layer 33 is correspondingly located above the first conducting layer 13. In another embodiment, the semiconductor structure may include a plurality of first conducting layers 13, for example, three first conducting layers; and similarly, the semiconductor structure may also include a plurality of second conducting layers 33.

Illustrated in the foregoing embodiments is the number setting of the first conducting layers and the second conducting layers. The number of first sub-conducting layers in the first conducting layer and the number of second sub-conducting layers in the second conducting layer may also be determined based on design requirements, for example, both of which may be two.

It should be noted that shapes and sizes of the first sub-conducting layers and the second sub-conducting layers are not limited. Take the first sub-conducting layer as an example, the first sub-conducting layer may be a continuous strip-shaped conducting layer or a conducting layer with a hollow pattern. The shape and size may be designed and determined based on an integration design requirement and a conduction requirement. In addition, two first sub-conducting layers may be manufactured by using a same metal layer manufacturing process to first form an integrated first conducting layer. When the two first sub-conducting layers need to be connected to each other, the first conducting layer is divided into two first sub-conducting layers. The boundary between the two first sub-conducting layers in FIG. 7b is merely illustrative and does not exist for real. When the two first sub-conducting layers need to be insulated, the first conducting layer may be divided into two insulated first sub-conducting layers as required.

In an adjustment situation, at later circuit design stage, if two potentials are unstable due to conditions such as electrical fluctuations, the capacitance of capacitors located between the two potentials can be increased. The two potentials are different.

Figure 8A:
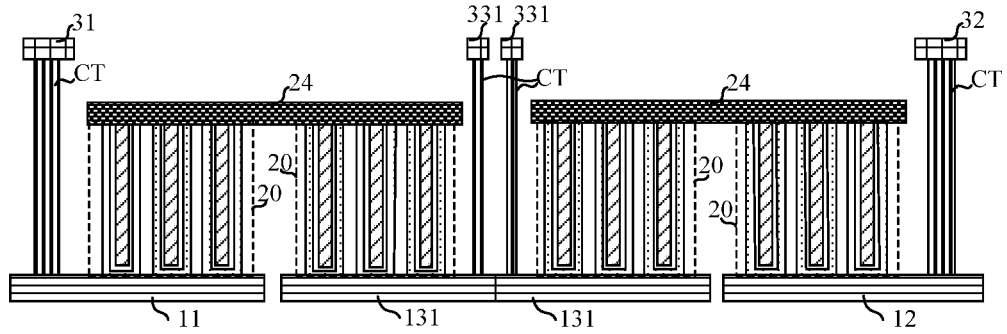
FIG. 8a is an exemplary diagram of a semiconductor structure according to an embodiment of this application.
Figure 8B:
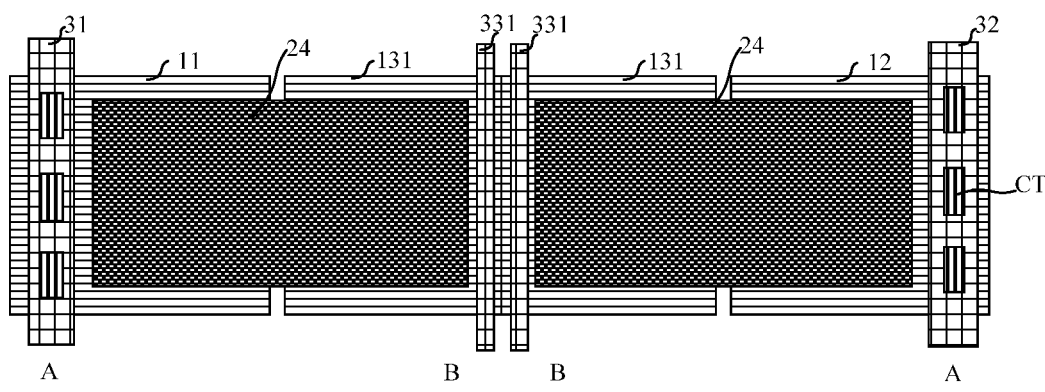

In an embodiment, as shown in FIG. 8a and FIG. 8b, FIG. 8a is an exemplary diagram of a semiconductor structure according to an embodiment of this application, and FIG. 8b is a top view of FIG. 8a. The semiconductor structure includes one first conducting layer 13 and one second conducting layer 33. Two first sub-conducting layers 131 of the first conducting layer 13 are connected to each other. Second sub-conducting layers 331 are respectively connected to the first sub-conducting layers 131 through via holes CT.

In this embodiment, there are one first conducting layer and one second conducting layer. The first conducting layer 13 includes two first sub-conducting layers 131, and the second conducting layer 33 includes two second sub-conducting layers 331. Each second sub-conducting layer 331 is connected to one first sub-conducting layer 131. By applying corresponding potentials to the third wire 31, the fourth wire 32, and the second conducting layer 331, the capacitance of a capacitor between two potentials corresponding to the third wire 31 and the fourth wire 32 can be increased.

In an embodiment, potentials of the third wire and the fourth wire are first potential, potentials of the two second sub-conducting layers are second potential, and the first potential is different from the second potential. Illustrated below is an example in which the first potential is potential A and the second potential is potential B.

Figure 9:
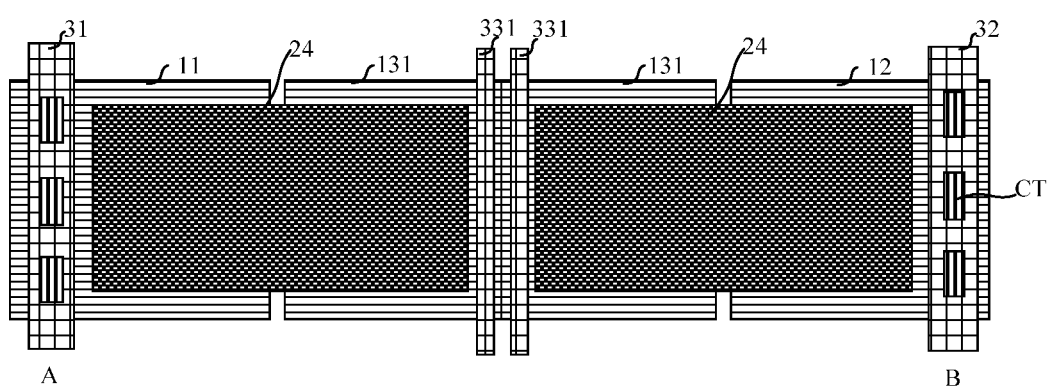
FIG. 9 is an exemplary diagram of a semiconductor structure before adjustment.

An example is given with reference to FIG. 8b and FIG. 9. FIG. 9 is an exemplary diagram of a semiconductor structure before adjustment. Correspondingly, FIG. 8b shows a structure after adjustment. Specifically, an example is given of improving the stability of potential A and potential B.

As shown in FIG. 9, before adjustment, to stabilize potential A and potential B, in the semiconductor structure, a potential of the third wire 31 is potential A, a potential of the fourth wire 32 is potential B, and potential A and potential B are stabilized by utilizing a capacitor between the two potentials. It can be understood that before adjustment, a total capacitor between potential A and potential B includes two capacitor banks in series, and the two capacitor banks share one capacitor plate. In addition, a second conducting layer 33 is reserved between the third wire 31 and the fourth wire 32. The second conducting layer 33 is not connected to the first conducting layer 13, or the second conducting layer 33 is connected to the first conducting layer 13 and is further connected to a floating potential.

During practical application, the manner of setting the wire potential is not limited. For example, the third wire 31 may be connected, through interconnecting wiring, to a module outputting potential A, or the third wire 31 may be connected, through interconnecting wiring, to a node whose potential is potential A.

As shown in FIG. 8b, if potential A and potential B are still unstable (for example, due to electrical fluctuation), although a capacitor is provided, the capacitance of the capacitor between potential A and potential B may be increased through adjustment. An exemplary adjustment is shown in FIG. 8b. In FIG. 8b, the reserved second conducting layer 33 is connected to the first conducting layer through a via hole CT. Specifically, each second sub-conducting layer 331 of the second conducting layer 33 is respectively connected to one first sub-conducting layer 131 of the first conducting layer 13 through a via hole CT. With the structure adjustment, potentials of the third wire 31 and the fourth wire 32 are adjusted to one of potential A and potential B, and potentials of the two second sub-conducting layers 331 of the second conducting layer 33 connected to the first conducting layer 13 are adjust to the other one of potential A and potential B.

The figure is merely exemplary. As shown in FIG. 8b, the potentials of the third wire 31 and the fourth wire 32 are adjusted to potential A, and the potentials of the two second sub-conducting layers 331 are adjusted to potential B. It can be understood that alternatively, the potentials of the third wire 31 and the fourth wire 32 may be adjusted to potential B, and the potentials of the two second sub-conducting layers 331 may be adjusted to potential A.

After the foregoing adjustment, the total capacitor between potential A and potential B includes two parallel capacitor banks. It's known that the capacitance of two capacitor banks connected in parallel is greater than the capacitance of the two capacitor banks connected in series. Therefore, the capacitance of the capacitor between potential A and potential B is increased, thereby improving the stability of potential A and potential B. In addition, based on the solution in this embodiment, during adjustment, only preparation of via holes and adjustment of metal wires are needed. The foregoing solution is also applicable even after the design of main structure in the bottom layer is completed to achieve flexible adjustment of the capacitor.

When potential A and potential B are unstable, based on the semiconductor structure with a second conducting layer reserved, another adjustment manner may also be used.

Figure 10A:
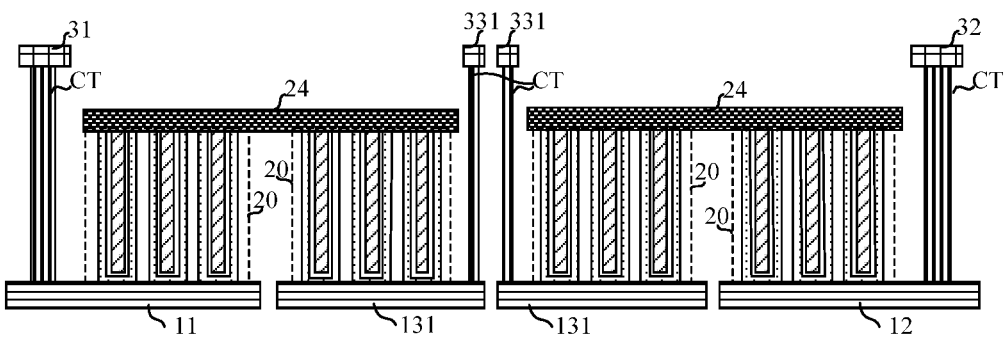
FIG. 10a is an exemplary diagram of a semiconductor structure according to an embodiment of this application.
Figure 10B:
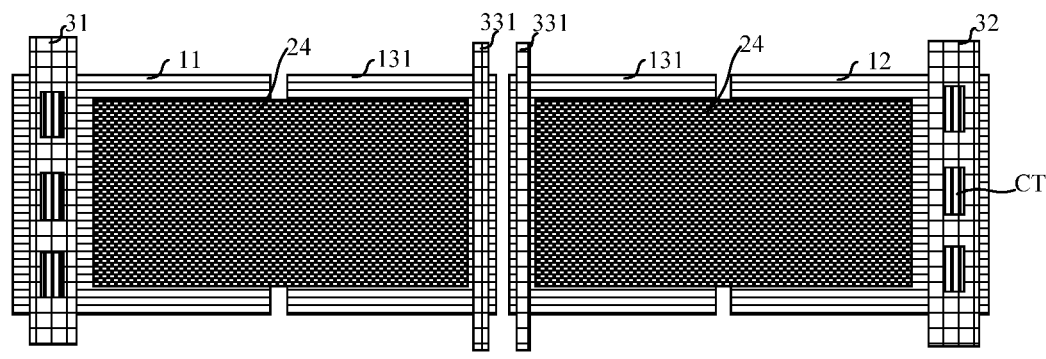

Specifically, in another embodiment, as shown in FIG. 10a and FIG. 10b, FIG. 10a is an exemplary diagram of a semiconductor structure according to an embodiment of this application, and FIG. 10b is a top view of FIG. 10a. The semiconductor structure includes one first conducting layer 13 and one second conducting layer 33. Two first sub-conducting layers 131 of the first conducting layer 13 are insulated from each other. Second sub-conducting layers 331 are respectively connected to the insulated first sub-conducting layers 131 through via holes CT.

In this embodiment, there are one first conducting layer 13 and one second conducting layer 33. The first conducting layer 13 includes two first sub-conducting layers 131, and the second conducting layer 33 includes two second sub-conducting layers 331. Each second sub-conducting layer 331 is connected to one first sub-conducting layer 131. The difference from the previous embodiment is that the two first sub-conducting layers 131 in this embodiment are insulated from each other. Based on this structure, by applying corresponding potentials to the third wire 31, the fourth wire 32, and the second conducting layer 331, the capacitance of a capacitor between two potentials corresponding to the third wire 31 and the fourth wire 32 can be increased.

In an embodiment, a potential of the second sub-conducting layer near the third wire is the same as a potential of the fourth wire, and a potential of the second sub-conducting layer near the fourth wire is the same as a potential of the third wire.

Figure 11:
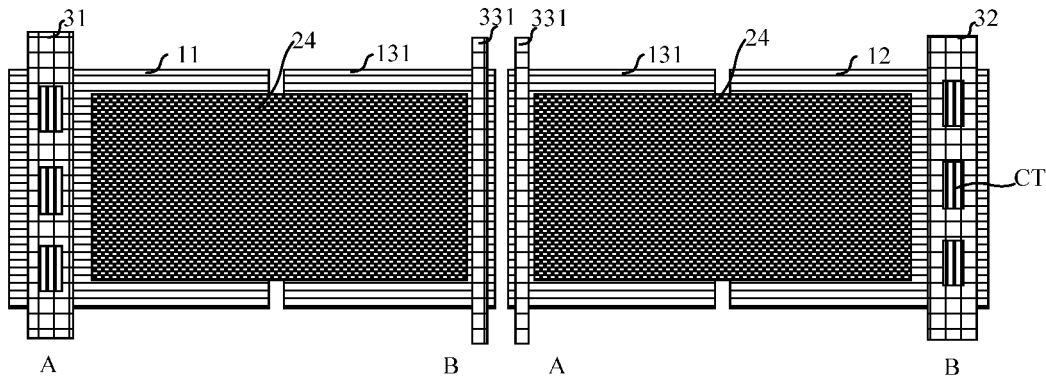
FIG. 11 is an exemplary diagram of the structure shown in FIG. 9 after adjustment.

An example is given with reference to FIG. 9 and FIG. 11. FIG. 9 is an exemplary diagram of a semiconductor structure before adjustment. Correspondingly, FIG. 11 is an exemplary diagram of the structure shown in FIG. 9 after adjustment. Specifically, another example is given of improving the stability of potential A and potential B.

As shown in FIG. 9, similar to the foregoing embodiment, before adjustment, to stabilize potential A and potential B, in the semiconductor structure, a potential of the third wire 31 is potential A, a potential of the fourth wire 32 is potential B, and potential A and potential B are stabilized by utilizing a capacitor between the two potentials. It can be understood that before adjustment, a total capacitor between potential A and potential B includes two capacitor banks in series.

If potential A and potential B are still unstable, for example, due to electrical fluctuation, the capacitance of the capacitor between potential A and potential B may be increased through adjustment. An exemplary adjustment is shown in FIG. 11. Referring to the semiconductor structure shown in FIG. 10b, a reserved second conducting layer 33 including two second sub-conducting layers 331 are respectively connected to the first sub-conducting layers 131 through via holes CT. Specifically, each second sub-conducting layer 331 of the second conducting layer 33 is connected to one first sub-conducting layer 131 of the first conducting layer 13 through a via hole CT. The two first sub-conducting layers 131 in this embodiment are insulated from each other.

With structure adjustment, potentials are adjusted based on the structure shown in FIG. 10b. Specifically, the potential of the third wire 31 is adjusted to one of potential A and potential B, the potential of the fourth wire 32 is adjusted to the other of potential A and potential B, and the potentials of the two second sub-conducting layers 331 are respectively adjusted to potential A and potential B. The potential of the third wire 31 is different from the potential of the second sub-conducting layers 331 adjacent to the third wire 31. The potential of the fourth wire 32 is also different from the potential of the second sub-conducting layer 331 adjacent to the fourth wire 32.

For example, the result obtained after adjustment is shown in FIG. 11. The potential of the third wire 31 is potential A, the potential of the fourth wire 32 is potential B, the potential of the second sub-conducting layer 331 near the third wire 31 is potential B, and the potential of the second sub-conducting layer 331 near the fourth wire 32 is potential A.

The figure is merely exemplary. It can be understood that alternatively, the potential of the third wire 31 may be adjusted to potential B, the potential of the second sub-conducting layer 331 near the third wire 31 may be adjusted to potential A, the potential of the fourth wire 32 is adjusted to potential A, and the potential of the second sub-conducting layer 331 near the fourth wire 32 is adjusted to potential B.

After the foregoing adjustment, the total capacitor between potential A and potential B includes two parallel capacitor banks. Therefore, the capacitance of the capacitor between potential A and potential B is increased compared with the capacitance of the capacitor before adjustment, thereby improving the stability of potential A and potential B. In addition, similarly, based on the solution in this embodiment, during adjustment, only preparation of via holes and adjustment of metal wires are needed to achieve flexible adjustment of the capacitor.

In another adjustment situation, at later circuit design stage, potential C between potential A and potential B may be unstable, for example, due to electrical fluctuation. In this case, the stability of potential C needs to be improved. Potential A is different from potential B.

In an embodiment, potentials may be adjusted based on the semiconductor structure shown in FIG. 10a and FIG. 10b. Specifically, in the semiconductor structure shown in FIG. 10b, the semiconductor structure includes one first conducting layer 13 and one second conducting layer 33. Two first sub-conducting layers 131 of the first conducting layer 13 are insulated from each other. Second sub-conducting layers 331 are respectively connected to the insulated first sub-conducting layers 131 through via holes CT.

Figure 12:
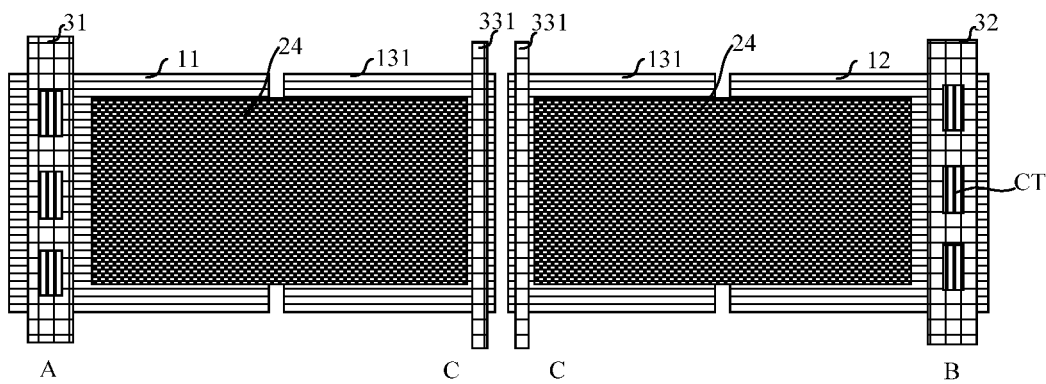
FIG. 12 is an exemplary diagram of a semiconductor structure according to an embodiment of this application.

In a potential adjustment manner, based on the structure shown in FIG. 10b, as shown in FIG. 12, FIG. 12 is an exemplary diagram of a semiconductor structure according to an embodiment of this application. Along a direction from the third wire 31 to the fourth wire 32, a potential of the second sub-conducting layer 331 is between a potential of the third wire 31 and a potential of the fourth wire 32, and the potential of the third wire 31 is different from the potential of the fourth wire 32.

An example is given with reference to FIG. 9 and FIG. 12. FIG. 9 is an exemplary diagram of a semiconductor structure before adjustment. Correspondingly, FIG. 12 shows a structure after adjustment. Specifically, another example is given of improving the stability of potential C between potential A and potential B. For example, potential A is 2 volts, potential B is 3 volts, and potential C is between the potential A and potential B, for example, 2.6 volts.

As shown in FIG. 9, before adjustment, to stabilize potential A and potential B, in the semiconductor structure, a potential of the third wire 31 is potential A, a potential of the fourth wire 32 is potential B, and potential A and potential B are stabilized by utilizing a capacitor between the two potentials. Two second sub-conducting layers 331 are reserved between the third wire 31 and the fourth wire 32.

As shown in FIG. 12, if potential C between potential A and potential B is unstable due to conditions, for example, electrical fluctuation, the stability of potential C can be improved through adjustment. An exemplary adjustment is shown in FIG. 12. In FIG. 12, adjustment is firstly performed based on the structure shown in FIG. 10b, two reserved second sub-conducting layers 331 are respectively connected to insulated first sub-conducting layers 131 through via holes CT. Specifically, each second sub-conducting layer 331 of the second conducting layer 33 is connected to one first sub-conducting layer 131 of the first conducting layer 13 through a via hole CT. With structure adjustment, potentials of the two second sub-conducting layers 331 are further adjusted to potentials C based on the structure shown in FIG. 10b.

The figure is merely exemplary. It can be understood that alternatively, the potential of the third wire 31 and the potential of the fourth wire 32 may be exchanged, that is, the potential of the third wire is adjusted to potential B, the potential of the fourth wire is adjusted to potential A, and the potentials of the two second sub-conducting layers 331 are adjusted to potentials C.

After the foregoing adjustment, potential C can be charged or discharged by utilizing a capacitor connected to potential C, thereby improving the stability of potential C. In addition, based on the solution in this embodiment, during adjustment, only preparation of via holes and adjustment of metal wires are needed to achieve flexible adjustment of the capacitor without changing the active area.

Figure 13:
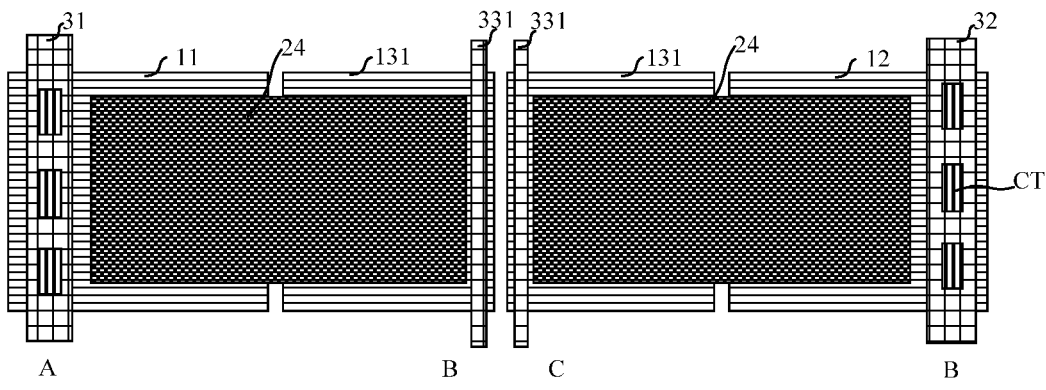
FIG. 13 is an exemplary diagram of a semiconductor structure according to an embodiment of this application.

Still, when potential C between potential A and potential B is unstable, in another potential adjustment manner, based on the structure shown in FIG. 10b, as shown in FIG. 13, FIG. 13 is an exemplary diagram of a semiconductor structure according to an embodiment of this application. A potential of the second sub-conducting layer near the third wire is the same as a potential of the fourth wire, and a potential of the second sub-conducting layer near the fourth wire is between a potential of the third wire and the potential of the fourth wire.

An example is given with reference to FIG. 9 and FIG. 13. FIG. 9 is an exemplary diagram of a semiconductor structure before adjustment. Correspondingly, FIG. 13 shows a structure after adjustment. Specifically, another example is given of improving the stability of potential C between potential A and potential B.

As shown in FIG. 9, before adjustment, to stabilize potential A and potential B, in the semiconductor structure, a potential of the third wire 31 is potential A, a potential of the fourth wire 32 is potential B, and potential A and potential B are stabilized by utilizing a capacitor between the two potentials. Two second sub-conducting layers 331 are reserved between the third wire 31 and the fourth wire 32.

As shown in FIG. 13, if potential C between potential A and potential B is unstable due to conditions, for example, electrical fluctuation, the stability of potential C can be improved through adjustment. An exemplary adjustment is shown in FIG. 13. In FIG. 13, adjustment is firstly performed based on the structure shown in FIG. 10b, two reserved second sub-conducting layers 331 are respectively connected to insulated first sub-conducting layers 131 through via holes CT. Specifically, each second sub-conducting layer 331 of the second conducting layer 33 is connected to one first sub-conducting layer 131 of the first conducting layer 13 through a via hole CT. With structure adjustment, further, based on the structure shown in FIG. 10b, the potential of the second sub-conducting layer 331 near the third wire 31 is adjusted to the potential of the fourth wire 32, namely, potential B, and the potential of the second sub-conducting layer 331 near the fourth wire 32 is adjusted to potential C.

The figure is merely exemplary. It can be understood that alternatively, the potential of the second sub-conducting layer 331 near the third wire 31 may be adjusted to potential C, and the potential of the second sub-conducting layer 331 near the fourth wire 32 is adjusted to the potential of the third wire 31, namely, potential A.

After the foregoing adjustment, potential C can be charged or discharged by utilizing a capacitor connected to potential C, thereby improving the stability of potential C. In addition, based on the solution in this embodiment, during adjustment, only preparation of via holes and adjustment of metal wires are needed to achieve flexible adjustment of the capacitor without changing the active area.

The above illustrates the stability optimization of a single potential between potential A and potential B. In an embodiment, a plurality of potentials between potential A and potential B can be optimized.

Figure 14A:
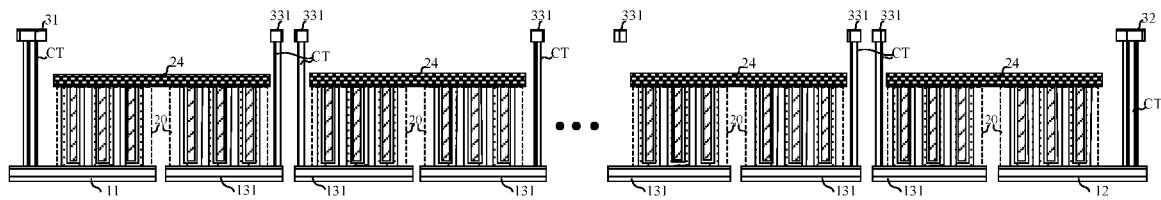
FIG. 14a is an exemplary diagram of a semiconductor structure according to an embodiment of this application.
Figure 14B:
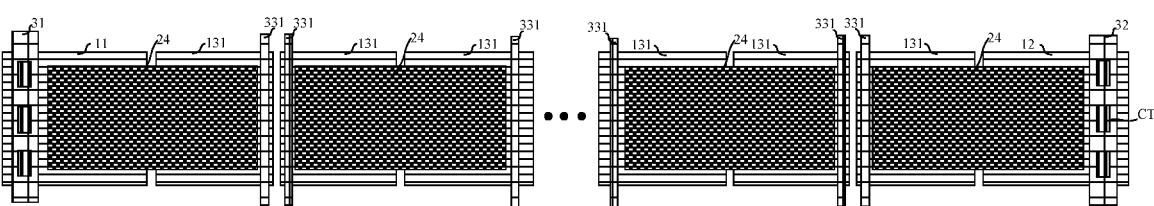

As shown in FIG. 14a and FIG. 14b. FIG. 14a is an exemplary diagram of a semiconductor structure according to an embodiment of this application, and FIG. 14b is a top view of FIG. 14a. Based on the example shown in FIG. 7b (that is, the first conducting layer includes two first sub-conducting layers and the second conducting layer includes two second sub-conducting layers), the semiconductor structure of FIG. 14a and FIG. 14b includes a plurality of first conducting layers 13 and a plurality of second conducting layers 33. Two first sub-conducting layers 131 of at least some first conducting layers 13 are insulated from each other. Second sub-conducting layers 331 are respectively connected to the insulated first sub-conducting layers 131 through via holes CT.

In this embodiment, there are a plurality of first conducting layers and a plurality of second conducting layers. Two first sub-conducting layers 131 of at least some first conducting layers 13 are insulated from each other, and corresponding second sub-conducting layers 331 are connected to the insulated first sub-conducting layers 131. The number of the "at least some first conducting layers" may be determined as required, for example, may be determined based on the number of potentials whose stability needs to be improved. Assuming that three potentials between potential A and potential B are unstable, in this case, three first conducting layers may be selected from all first conducting layers, and first sub-conducting layers of such three first conducting layers are adjusted to become insulated from each other.

During practical application, the manner of insulating the first sub-conducting layers may not be limited. For example, the first sub-conducting layers may be insulated through a process such as etching.

In an embodiment of potential adjustment, along a direction from the third wire to the fourth wire, potentials of the second sub-conducting layers connected to the first sub-conducting layers gradually decrease.

Figure 15:
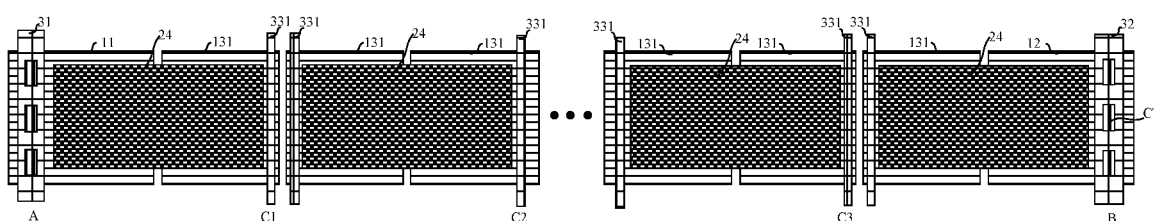
FIG. 15 shows an exemplary potential adjustment manner.

For example, as shown in FIG. 15, FIG. 15 shows an exemplary potential adjustment manner. Assuming that a plurality of potentials, that is, potential C1, potential C2, and potential C3 between potential A and potential B are unstable, in this case, three first conducting layers may be selected from a plurality of first conducting layers 13, and first sub-conducting layers 131 of such three first conducting layers are arranged to be insulated from each other, and are connected to corresponding second sub-conducting layers 331 through via holes CT. Potentials of the second sub-conducting layers 331 corresponding to the three first conducting layers are adjusted to gradually decrease. It should be noted that the figure is merely exemplary. During practical application, the potentials may be changed based on actual situations.

The semiconductor structure provided in the foregoing embodiments includes: a first wire, a second wire, and at least one first conducting layer located between the first wire and the second wire; a plurality of capacitor banks, where each capacitor bank is respectively located on the first wire, the second wire, or the first conducting layer, and two capacitor banks are located on each first conducting layer, and where each capacitor bank includes at least one capacitor, the capacitor includes a first electrode layer, a capacitor dielectric layer, and a second electrode layer sequentially from bottom to top, the first electrode layer is respectively electrically connected to the corresponding first wire, second wire, or first conducting layer; at least one capacitor plate located on the second electrode layer, where along a direction from the first wire to the second wire, second electrode layers of two adjacent capacitor banks are electrically connected to a same capacitor plate; and a third wire, a fourth wire, and a second conducting layer located between the third wire and the fourth wire, where the third wire is located above the first wire and is connected to the first wire, and the fourth wire is located above the second wire and is connected to the second wire; and an orthographic projection of the second conducting layer on a plane on which the capacitor plates are located is located between two adjacent capacitor plates. In this application, the second conducting layer is reserved. When the capacitance of the capacitor needs to be adjusted, only a portion of the structure, instead of the entire structure, needs to be changed to implement a capacitor structure that can be flexibly adjusted.

Other embodiments of this application will readily occur to a person skilled in the art upon consideration of this specification and practice of the invention disclosed herein. This application is intended to cover any variations, uses, or adaptations hereof that follow the general principles of this application and include common knowledge or conventional techniques in the technical field not disclosed in this application. This specification and embodiments are merely exemplary, with the true scope and spirit of the application being indicated by the following claims.

It should be understood that this application is not limited to the precise structures described above and illustrated in the accompanying drawings, and that various modifications and changes may be made without departing from the scope of this application. The scope of this application is subject only to the appended claims.

What is claimed is:

1. A semiconductor structure, comprising:
a first wire, a second wire, and a first conducting layer located between the first wire and the second wire;
a plurality of capacitor banks, wherein each capacitor bank is respectively located on the first wire, the second wire, or the first conducting layer, and two capacitor banks are located on the first conducting layer, and wherein each capacitor bank comprises at least one capacitor, the capacitor comprises a first electrode layer, a second electrode layer, and a capacitor dielectric layer disposed between the first electrode layer and the second electrode layer, the first electrode layer of each capacitor bank is respectively electrically connected to the corresponding first wire, second wire, or the first conducting layer;
a third wire and a fourth wire, wherein the third wire is located above the first wire and is connected to the first wire through a via hole, and the fourth wire is located above the second wire and is connected to the second wire through a via hole;
at least two capacitor plates located above second electrode layers, wherein along a direction from the first wire to the second wire, the second electrode layers of two adjacent capacitor banks are electrically connected to a same capacitor plate; and
a second conducting layer, wherein the second conducting layer is located between the third wire and the fourth wire, and an orthographic projection of the second conducting layer on a plane on which the capacitor plates are disposed is located between two adjacent capacitor plates,
wherein the first conducting layer comprises two first sub-conducting layers, the second conducting layer comprises two second sub-conducting layers, and a projection of one second sub-conducting layer on a plane on which the first conducting layer is disposed is located on a corresponding one first sub-conducting layer, and wherein the two first sub-conducting layers of the first conducting layer are electronically connected to each other, and one of the second sub-conducting layers is connected to a corresponding one of the first sub-conducting layers through a corresponding via hole.

2. The semiconductor structure according to claim 1, wherein the first wire, the second wire, and the first conducting layer are located in a same layer.

3. The semiconductor structure according to claim 1, wherein the third wire, the fourth wire, and the second conducting layer are located in a same layer.

4. The semiconductor structure according to claim 1, wherein an orthographic projection of the second conducting layer on a plane on which the first conducting layer is disposed is located on the first conducting layer.

5. The semiconductor structure according to claim 1, wherein at least a portion of the second conducting layer is connected to the first conducting layer under the second conducting layer through a via hole.

6. The semiconductor structure according to claim 5, wherein a potential of the second conducting layer connected to the first conducting layer is between a potential of the third wire and a potential of the fourth wire.

7. The semiconductor structure according to claim 5, wherein the second conducting layer connected to the first conducting layer is connected to a floating potential.

8. The semiconductor structure according to claim 1, wherein the third wire and the fourth wire are at a first potential, the two second sub-conducting layers are at a second potential, and the first potential is different from the second potential.

9. The semiconductor structure according to claim 1, wherein the semiconductor structure comprises four capacitor banks, one capacitor bank is located on the first wire and one capacitor bank is located on the second wire.

10. A semiconductor structure, comprising:
   a first wire, a second wire, and a first conducting layer located between the first wire and the second wire;
   a plurality of capacitor banks, wherein each capacitor bank is respectively located on the first wire, the second wire, or the first conducting layer, and two capacitor banks are located on the first conducting layer, and wherein each capacitor bank comprises at least one capacitor, the capacitor comprises a first electrode layer, a second electrode layer, and a capacitor dielectric layer disposed between the first electrode layer and the second electrode layer, the first electrode layer of each capacitor bank is respectively electrically connected to the corresponding first wire, second wire, or the first conducting layer;
   a third wire and a fourth wire, wherein the third wire is located above the first wire and is connected to the first wire through a via hole, and the fourth wire is located above the second wire and is connected to the second wire through a via hole;
   at least two capacitor plates located above second electrode layers, wherein along a direction from the first wire to the second wire, the second electrode layers of two adjacent capacitor banks are electrically connected to a same capacitor plate; and
   a second conducting layer, wherein the second conducting layer is located between the third wire and the fourth wire, and an orthographic projection of the second conducting layer on a plane on which the capacitor plates are disposed is located between two adjacent capacitor plates,
   wherein the first conducting layer comprises two first sub-conducting layers, the second conducting layer comprises two second sub-conducting layers, and a projection of one second sub-conducting layer on a plane on which the first conducting layer is disposed is located on a corresponding one first sub-conducting layer, wherein the two first sub-conducting layers of the first conducting layer are insulated from each other, and one of the second sub-conducting layers is connected to a corresponding one of the insulated first sub-conducting layers through a corresponding via hole, and wherein respective potentials are applied to the third wire, the fourth wire, and the two second sub-conducting layers, and a potential of the third wire is different from a potential of the fourth wire.

11. The semiconductor structure according to claim 10, wherein along a direction from the third wire to the fourth wire, a potential of one of the second sub-conducting layers is between the potential of the third wire and the potential of the fourth wire.

12. The semiconductor structure according to claim 10, wherein a potential of one of the second sub-conducting layers near the third wire is the same as a potential of the fourth wire, a potential of one of the second sub-conducting layers near the fourth wire is the same as a potential of the third wire, and the potential of the third wire is different from the potential of the fourth wire.

13. The semiconductor structure according to claim 10, wherein a potential of one of the second sub-conducting layers near the third wire is the same as a potential of the fourth wire, a potential of one of the second sub-conducting layers near the fourth wire is between a potential of the third wire and the potential of the fourth wire, and the potential of the third wire is different from the potential of the fourth wire.

14. The semiconductor structure according to claim 10, wherein the first conducting layer is one of a plurality of first conducting layers and the second conducting layer is one of a plurality of second conducting layers, each of the plurality of first conducting layers comprises two first sub-conducting layers and each of the plurality of second conducting layers comprises two second sub-conducting layers, the two first sub-conducting layers of at least some of the plurality of first conducting layers are insulated from each other, and one of the two second sub-conducting layers of some of the plurality of second conducting layers that are located above the at least some of the plurality of first conducting layers is connected to a corresponding one of the insulated first sub-conducting layers through a corresponding via hole.

15. The semiconductor structure according to claim 14, wherein along a direction from the third wire to the fourth wire, potentials of the second sub-conducting layers connected to the corresponding one of the insulated first sub-conducting layers gradually decrease.

* * * * *